US006691270B2

United States Patent
Blasco Allué et al.

(10) Patent No.: US 6,691,270 B2
(45) Date of Patent: Feb. 10, 2004

(54) INTEGRATED CIRCUIT AND METHOD OF OPERATION OF SUCH A CIRCUIT EMPLOYING SERIAL TEST SCAN CHAINS

(75) Inventors: Conrado Blasco Allué, Cherry Hinton (GB); Ian Victor Devereux, Fulbourn (GB)

(73) Assignee: ARM Limited, Cambridge (GB)

( * ) Notice: Subject to any disclaimer, the term of this patent is extended or adjusted under 35 U.S.C. 154(b) by 376 days.

(21) Appl. No.: 09/741,897

(22) Filed: Dec. 22, 2000

(65) Prior Publication Data

US 2002/0124216 A1 Sep. 5, 2002

(51) Int. Cl.[7] .............................................. G01R 31/28
(52) U.S. Cl. ...................................... 714/729; 714/741
(58) Field of Search ................................ 714/726–729, 714/738, 741

(56) References Cited

U.S. PATENT DOCUMENTS

| | | | | |
|---|---|---|---|---|
| 4,872,469 A | * | 10/1989 | Schultz | 714/727 |
| 5,636,227 A | | 6/1997 | Segars | |
| 5,768,289 A | * | 6/1998 | James | 714/727 |
| 5,898,704 A | * | 4/1999 | Kawano | 704/727 |
| 5,983,017 A | * | 11/1999 | Kemp et al. | 717/129 |
| 6,266,793 B1 | * | 7/2001 | Mozdzen et al. | 714/727 |
| 6,324,096 B1 | * | 11/2001 | Tomita | 365/185.05 |
| 6,446,221 B1 | * | 9/2002 | Jaggar et al. | 714/30 |

OTHER PUBLICATIONS

"microSPARC–IIep: Introduction to JTAG Boundary Scan", White Paper, Sun Microsystems, Jan., 1997.*
"IEEE Std 1149.1 (JTAG) Testability Primer", Texas Instruments, 1997.*
Smith, "Applications Integrated Circuits", Addison–Wesley, 1997, pp. 714–732.*

* cited by examiner

Primary Examiner—Guy J. Lamarre
(74) Attorney, Agent, or Firm—Nixon & Vanderhye P.C.

(57) ABSTRACT

The present invention provides a technique for operating an integrated circuit comprising a plurality of circuit elements, with a plurality of serial test scan chains, each being coupled to a different one of the circuit elements. A scan chain selector is responsive to a specified scan chain specifying value to select a corresponding one of the plurality of test scan chains. A scan chain controller is also provided which has a serial interface for receiving signals from outside of the integrated circuit, the scan chain controller comprising an instruction decoder for decoding scan chain controller instructions received from the serial interface. In accordance with the present invention, the decoder is responsive to a first scan chain controller instruction to specify a predetermined scan chain specifying value and a second scan chain controller instruction for decoding by the decoder. The provision of such a first scan chain controller instruction enables the efficiency of the testing procedure to be improved.

17 Claims, 5 Drawing Sheets

INTEGRATED CIRCUIT AND METHOD OF OPERATION OF SUCH A CIRCUIT EMPLOYING SERIAL TEST SCAN CHAINS

BACKGROUND OF THE INVENTION

1. Field of the Invention

This invention relates to an integrated circuit and method of operation of such a circuit, and in particular to integrated circuits that use serial test scan chains for applying signals to and capturing signals from predetermined circuit elements within an integrated circuit.

2. Description of the Prior Art

Integrated circuit testing using serial test scan chains is known from the JTAG system that is the subject of IEEE Standard 1149.1-1990. In accordance with this Standard, an entire integrated circuit is treated as a whole and tested together.

However, as the complexity of integrated circuits has increased, it has become more desirable to test individual circuit elements within the integrated circuit, and accordingly integrated circuits have been developed which incorporate a number of separate serial test scan chains, each being coupled to a different circuit element to be tested.

Typically, testing hardware external to the integrated circuit will access the test scan chain via a scan chain controller provided on the integrated circuit, the scan chain controller having a serial interface for communicating with the testing hardware.

Where multiple serial test scan chains are provided, it is known to provide a scan chain selecting instruction which is decoded by the scan chain controller to cause the scan chain controller to capture a scan chain specifying value received at the serial interface, and to use that scan chain specifying value to select a serial test scan chain upon which further instructions received at said serial interface are to be effected. A description of such a scan chain selecting instruction is provided in U.S. Pat. No. 5,636,227.

Hence, to specify an instruction to be applied in relation to a desired scan chain, it is first necessary to scan a scan chain selecting instruction into the scan chain controller, then to scan the appropriate scan chain specifying value into the scan chain controller, and then to scan in the actual instruction to be applied. It has been found that this process can impact on the efficiency of the testing procedure, particularly in scenarios where this process is repeated many times.

Accordingly, it would be desirable to improve the efficiency of the testing procedure when the above process is required.

SUMMARY OF THE INVENTION

Viewed from a first aspect, the present invention provides an integrated circuit comprising: a plurality of circuit elements; a plurality of serial test scan chains each coupled to a different one of said circuit elements; a scan chain selector responsive to a specified scan chain specifying value to select a corresponding one of said plurality of test scan chains; a scan chain controller having a serial interface for receiving signals from outside of said integrated circuit, said scan chain controller comprising an instruction decoder for decoding scan chain controller instructions received from said serial interface; the decoder being responsive to a first scan chain controller instruction to specify a predetermined scan chain specifying value and a second scan chain controller instruction for decoding by the decoder.

It has been found that there are a number of testing procedures where much of the testing involves using only a subset of the scan chain controller instructions in relation to a subset of the available test scan chains. Given this fact, the present invention specifies a first scan chain controller instruction that is arranged to cause the decoder to specify a predetermined scan chain specifying value and a second scan chain controller instruction. Accordingly, in situations where the predetermined scan chain specifying value corresponds to a frequently used scan chain, and the second scan chain controller instruction is a frequently used instruction in relation to that scan chain, then the use of the first scan chain controller instruction can significantly improve the efficiency of the testing procedure by avoiding the requirement for the multi-step process described earlier each time that instruction is to be applied in relation to that scan chain.

In preferred embodiments, the integrated circuit further comprises: an instruction register for storing a scan chain controller instruction to be decoded by the decoder; and a scan chain register for storing a scan chain specifying value to be referenced by the scan chain selector to determine which test scan chain to select. Typically, both the instruction register and the scan chain register will reside within the scan chain controller, as will the scan chain selector in preferred embodiments.

In one embodiment, the decoder may be arranged to be responsive to the first scan chain controller instruction to cause the predetermined scan chain specifying value to be written into the scan chain register, and the second scan chain controller instruction to be written into the instruction register.

However, it has been found that a more efficient approach is to cause the decoder to simulate appropriate outputs from the instruction register and the scan chain register without actually storing either the predetermined scan chain specifying value or the second scan chain controller instruction in the scan chain register and instruction register, respectively. More particularly, in preferred embodiments, the decoder is responsive to the first scan chain controller instruction to simulate as the output of the instruction register the second scan chain controller instruction and to simulate as the output of the scan chain register the predetermined scan chain specifying value without the contents of the instruction register and scan chain register being updated.

In preferred embodiments, the integrated circuit further comprises a first multiplexer located between the instruction register and the decoder having a first input connected to the instruction register and a second input arranged to receive the second scan chain controller instruction, the decoder incorporating a pre-decoder responsive to the first scan chain controller instruction to cause the first multiplexer to output the instruction received at the second input. It will be appreciated that the first multiplexer and pre-decoder can be incorporated as part of the decoder itself. However, by embodying the first multiplexer and the pre-decoder function as a separate logical function to the remainder of the decoder, this avoids the requirement to make any alterations to the instruction decoder itself.

Further, in preferred embodiments, the integrated circuit further comprises a second multiplexer located between the scan chain register and the scan chain selector having a first input connected to the scan chain register and a second input arranged to receive the predetermined scan chain specifying value, the pre-decoder being responsive to the first scan chain controller instruction to cause the second multiplexer to output the data received at the second input.

It will be appreciated that the above described techniques could be employed in relation to the testing of a variety of different circuit elements that have scan chains associated therewith. However, in preferred embodiments, one of the circuit elements is an instruction transfer register for specifying an instruction to be executed by a microprocessor of the integrated circuit, and the predetermined scan chain specifying value identifies a test scan chain incorporating a shift register for shifting data into said instruction transfer register. In these preferred embodiments, the testing procedure is actually used not to test the integrated circuit as such, but to debug applications executing on the integrated circuit. In particular the testing mechanism of the invention is used to access on-chip hardware such as the instruction transfer register to enable application debugging.

In such preferred embodiments, the decoder is preferably responsive to the second scan chain controller instruction to cause the scan chain selector to be coupled to the serial interface to enable instruction data received at the serial interface to be passed to the shift register of the test scan chain identified by the predetermined scan chain specifying value. Hence, decoding of the first scan chain controller instruction will cause the test scan chain associated with the instruction transfer register to be selected, and the scan chain selector to be coupled to the serial interface to enable instruction data to subsequently be passed in through the serial interface to the shift register of the test scan chain.

Further, in preferred embodiments, once the instruction data has been shifted into the shift register, it is written into the instruction transfer register, and the microprocessor is caused to execute the instruction specified by the instruction data, with the resulting data being written to a data transfer register. In preferred embodiments, the second scan chain controller instruction that is specified via the first scan chain controller instruction actually causes the coupling of the scan chain selector to the serial interface, and the subsequent writing of the instruction data into the instruction transfer register from the shift register. Preferably, the scan chain controller then returns to a mode of operation which, in combination with the second scan chain controller instruction still being set, causes a signal to be issued to the microprocessor to cause it to execute the instruction specified by the instruction data in the instruction transfer register.

In many situations, it is also desirable to look at the data written into the data transfer register as a result of the microprocessor executing the instruction within the instruction transfer register. Accordingly, in preferred embodiments, the data transfer register is also one of the circuit elements, and the scan chain register is arranged to store the scan chain specifying value identifying the test scan chain coupled to the data transfer register, that test scan chain incorporating a shift register for shifting data into and out of said data transfer register. In preferred embodiments, the scan chain specifying value for the test scan chain coupled to the data transfer register can be stored in the scan chain register even before the first scan chain controller instruction is executed, since in preferred embodiments, execution of the first scan chain controller instruction does not require the contents of the scan chain register to be updated, since instead a simulated output of the scan chain register is produced.

In preferred embodiments, once data has been written to the data transfer register, a third scan chain controller instruction is input to the scan chain controller, the decoder being responsive to the third scan chain controller instruction to cause the scan chain selector to be coupled to the serial interface to enable the data in the data transfer register to be stored into the shift register of the test scan chain coupled to the data transfer register and then output over the serial interface.

It has been found that in such preferred embodiments, where instruction data is to be written to the instruction transfer register, the microprocessor is then to execute the instruction and store the resultant data in the data transfer register, and that data is then to be read out by the serial interface, the use of the first scan chain controller instruction is particularly beneficial. This is because the scan chain specifying value for the test scan chain coupled to the data transfer register can be stored into the scan chain register, and the first scan chain controller instruction can then be decoded to cause the test scan chain associated with the instruction transfer register to be used to load an instruction into the instruction transfer register (even though that test scan chain is not the one indicated by the contents of the scan chain register). This can then be followed merely by the third scan chain controller instruction to cause the resulting data to be read out from the data transfer register into the associated test scan chain, and then output from the integrated circuit via the serial interface, since the scan chain register already identifies the test scan chain coupled to the data transfer register. It is often the case that such a procedure is executed back-to-back, and in such situations it is clear that even further performance benefits can be realised by using the approach of the preferred embodiment.

Another preferred embodiment where the use of the first scan chain controller instruction is particularly beneficial is where data is first scanned into the data transfer register, and then an instruction is loaded into the instruction transfer register, whereafter the instruction is executed to cause the data to be transferred to, for example, processor memory.

Accordingly, in such preferred embodiments, one of said circuit elements is a data transfer register, and the scan chain register is arranged to store the scan chain specifying value identifying the test scan chain coupled to the data transfer register, that test scan chain incorporating a shift register for shifting data into and out of said data transfer register. Preferably, data is first stored in the data transfer register using the second scan chain controller instruction, and then the first scan chain controller instruction is used to shift instruction data into the shift register, from where it is written into the instruction transfer register. Further, the microprocessor is preferably caused to execute the instruction specified by the instruction data, this causing the data in the data transfer register to be transferred to a location accessible by the microprocessor. This location may for example be another register or a memory position accessible by the microprocessor.

An example of how an application can be debugged using the instruction transfer register (ITR) and the data transfer register (DTR) accessed in accordance with the techniques of preferred embodiments is as follows. Firstly, it is assumed that the application is running, and that a watchpoint has been set up on a certain memory address. When the application code accesses that memory address, the watchpoint generates a hit and the processor stops executing instructions and waits for an instruction from the ITR. Using the techniques of the preferred embodiments, an instruction can be scanned into the ITR that, when executed by the processor, will cause the data value associated with that memory position to be stored in the DTR. This data value can then be checked by scanning it out from the DTR via the relevant test scan chain. If it is discovered that the data value has a wrong value, the right data value can be provided to the processor and the processor can then be restarted to check that the application completes execution correctly, thereby verifying that the source of the bug is related to the wrong data value.

The earlier mentioned IEEE Standard identified, amongst other things, two scan chain controller instructions called EXTEST and INTEST. The EXTEST instruction allowed testing of off-chip circuitry and board level interconnections, whilst the INTEST instruction allowed testing of the on-chip system logic. In preferred embodiments of the present invention, the EXTEST and INTEST instructions are used in a different manner. More particularly, the EXTEST instruction is used to invoke a process whereby old data is copied from a register into a shift register of a corresponding test scan chain, the old data is then shifted out of the shift register whilst new data is shifted into the shift register, and finally the new data is then written into the register. The INTEST instruction is used to invoke a process whereby the data within a register is copied into the shift register of a corresponding test scan chain, and then that data is shifted out of the shift register via the serial interface.

Accordingly, in preferred embodiments, the second scan chain controller instruction is EXTEST. Furthermore, the third scan chain controller instruction is preferably either INTEST or EXTEST.

Viewed from a second aspect, the present invention provides a method of operating an integrated circuit comprising a plurality of circuit elements, and a plurality of serial test scan chains each coupled to a different one of said circuit elements, the method comprising the steps of: responsive to a specified scan chain specifying value, selecting a corresponding one of said plurality of test scan chains; employing a decoder to decode scan chain controller instructions received at a serial interface of the integrated circuit; the decoder being responsive to a first scan chain controller instruction to specify a predetermined scan chain specifying value and a second scan chain controller instruction for decoding by the decoder.

Viewed from a third aspect, the present invention provides a computer program product carrying a computer program for controlling an integrated circuit in accordance with the method of the second aspect of the present invention.

BRIEF DESCRIPTION OF THE DRAWINGS

The present invention will be described further, by way of example only, with reference to a preferred embodiment thereof as illustrated in the accompanying drawings, in which.

DESCRIPTION OF A PREFERRED EMBODIMENT

Figure 1:
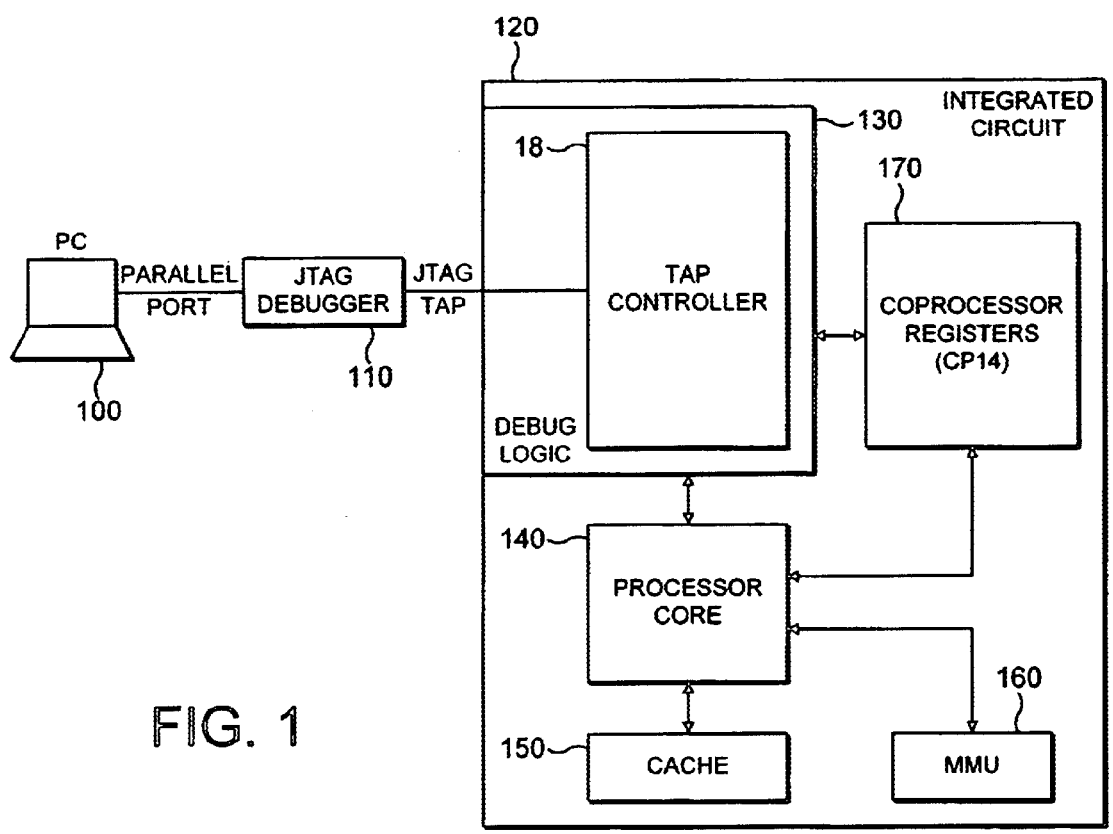
FIG. 1 is block diagram schematically illustrating an integrated circuit of preferred embodiments of the present invention connected to appropriate testing hardware.

FIG. 1 is a block diagram illustrating an integrated circuit 120 arranged in accordance with preferred embodiments of the present invention. As illustrated in FIG. 1, the integrated circuit includes a scan chain controller 18 (hereafter referred to as a TAP (Test Access Port) Controller) which is connected via a serial JTAG TAP interface to a JTAG Debugger 110. The JTAG Debugger 110 can be any appropriate piece of hardware used to connect the testing hardware (here a host PC 100) to the JTAG TAP interface of the integrated circuit 120.

In preferred embodiments, the TAP Controller 18 is provided as part of debug logic 130 provided within the integrated circuit 120. As will be appreciated by those skilled in the art, the debug logic may also include other logic circuits for performing debug functions, for example breakpoint, watchpoint and vector trap logic. However, as these additional debug functions are not relevant to an understanding of the preferred embodiment of the present invention, they have not been illustrated in FIG. 1.

The integrated circuit will typically include a number of discrete circuit units for performing given functions within the integrated circuit, for example a processor core 140, a cache 150, a Memory Management Unit (MMU) 160 and coprocessor registers 170. Typically, a number of scan chains originating and ending at the TAP Controller 18 will be provided that pass through different ones of these discrete circuit units, and accordingly a subset of scan chains may pass through the processor core 140, another subset of scan chains may pass through the cache 150, another subset of scan chains may pass through the MMU 160, and another subset of scan chains may pass through the coprocessor registers 170. For the purpose of illustrating the preferred embodiment of the present invention, specific reference will be made to the subset of scan chains which pass through the coprocessor registers 170, in preferred embodiments separate scan chains being provided for individual registers within the coprocessor registers 170. These individual scan chains will be discussed later with reference to FIG. 3.

Figure 2:
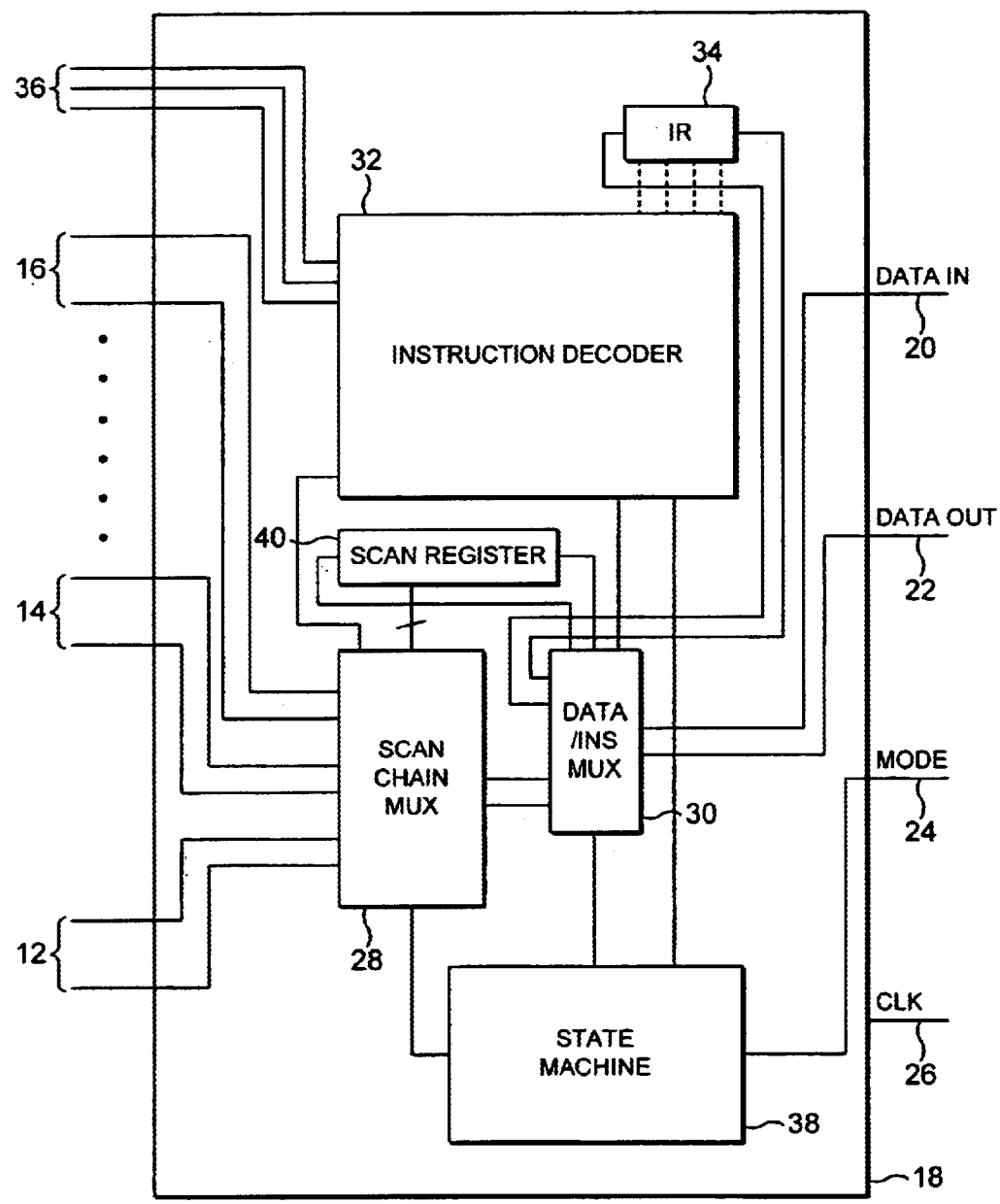
FIG. 2 is a block diagram illustrating components of the scan chain controller (also referred to herein as the TAP Controller) of preferred embodiments of the present invention.

FIG. 2 illustrates the TAP Controller 18 in more detail. The TAP Controller 18 includes a scan chain multiplexer 28 that selects between the serial test scan chains 12, 14, 16, etc. to be coupled between the data input 20 and the data output 22. An input multiplexer 30 serves to switch signals received at the data input 20 to be processed either as instructions to be decoded by an instruction decoder 32, as scan chain specifying signals directed to the scan chain register 40, or as data to be output onto one of the serial scan chains 12, 14, 16, etc.

Instruction data is directed by the input multiplexer 30 to an instruction register (IR) 34 into which it is serially clocked. When a complete instruction has been loaded into IR 34, the instruction decoder 32 interprets the instruction and generates appropriate control signals for use within the TAP Controller 18 and for output to elements of the serial test scan chain circuitry outside of the TAP Controller 18 via control lines 36.

The manner in which the TAP Controller 18 treats received signals is primarily controlled by a state machine 38. The state machine is moved between states by the value of a signal applied to the mode input 24. Depending upon the current state in which the state machine 38 is placed, received signals are treated as instructions or data. For example, the state machine 38 controls the switching of the input multiplexer 30 to direct data signals to the scan chain multiplexer 28, instruction signals to the instruction register 34, and in combination with the instruction decoder 32, scan chain specifying signals to a scan chain register (SCREG) 40. It should be noted that the data signals that may be passed to the scan chain multiplexer 28 can actually represent instructions, for example instructions to be executed by the processor core 140, instead of being true data values.

The state machine 38 also serves to indicate to the instruction decoder 32 when a complete instruction word has been loaded into the instruction register 34 and should be decoded, and indicates to the scan chain multiplexer 28 when a complete scan chain specifying value has been loaded into the scan chain register 40 and is ready to be used.

A known technique for selecting one of the test scan chains is to use a scan chain selecting instruction called (Scan-N), as described in detail in U.S. Pat. No. 5,636,297. To read in the Scan-N instruction, the state machine 38 is moved through an instruction capturing and interpretation section (designated by numeral 42 in FIG. 5 to be discussed later) and the Scan-N instruction is then loaded into the instruction register 34. The instruction decoder 32 then decodes this instruction. The state machine 38 is then moved through a data capturing and interpretation section (designated by numeral 44 in FIG. 5 to be discussed later) where signals received at the data input 20 are treated as data. A combination of the signal applied by the state machine 38 to the input multiplexer 30 and a signal supplied by the instruction decoder 32 upon recognition of a Scan-N instruction serve to switch the input multiplexer 30 to direct received signals to the scan chain register 40. A scan chain specifying value, hereafter referred to as a scan chain number, is then clocked into the scan chain register 40. The state machine 38 is then moved through a state indicating that the date capture has been completed and generates a signal that is supplied to the scan chain multiplexer 28 to cause it to use the value within the scan chain register 40 to select one of the scan chains 12, 14, 16, etc. for use. At this point, another scan chain controller instruction can be read in via the serial interface into the instruction register 34, this instruction then being applied in relation to the selected scan chain.

Hence, given the above description, it can be seen that, in accordance with the above prior art technique, each time a scan chain needs to be selected, and an instruction applied in relation to that scan chain, the following sequence of steps needs to be performed:

1. Scan the Scan-N instruction into the IR register
2. Scan the target scan chain number into the SCREG register
3. Scan in the required instruction to be applied to the selected scan chain Considering the scan chains that pass to individual registers within the coprocessor registers 170, the required instruction that needs to be scanned in at step three is typically either INTEST or EXTEST, INTEST being used to read data out of the register using the scan chain, and to then output that data via the JTAG TAP interface, whilst EXTEST is used to write data input by the JTAG TAP interface into the register.

It has been found that the JTAG Debugger 110 often spends a great amount of time executing back-to-back JTAG sequences requiring the three steps identified above, where most of the time the sequences are concentrated on just two or three scan chains and use either the INTEST or EXTEST instruction.

Figure 3:
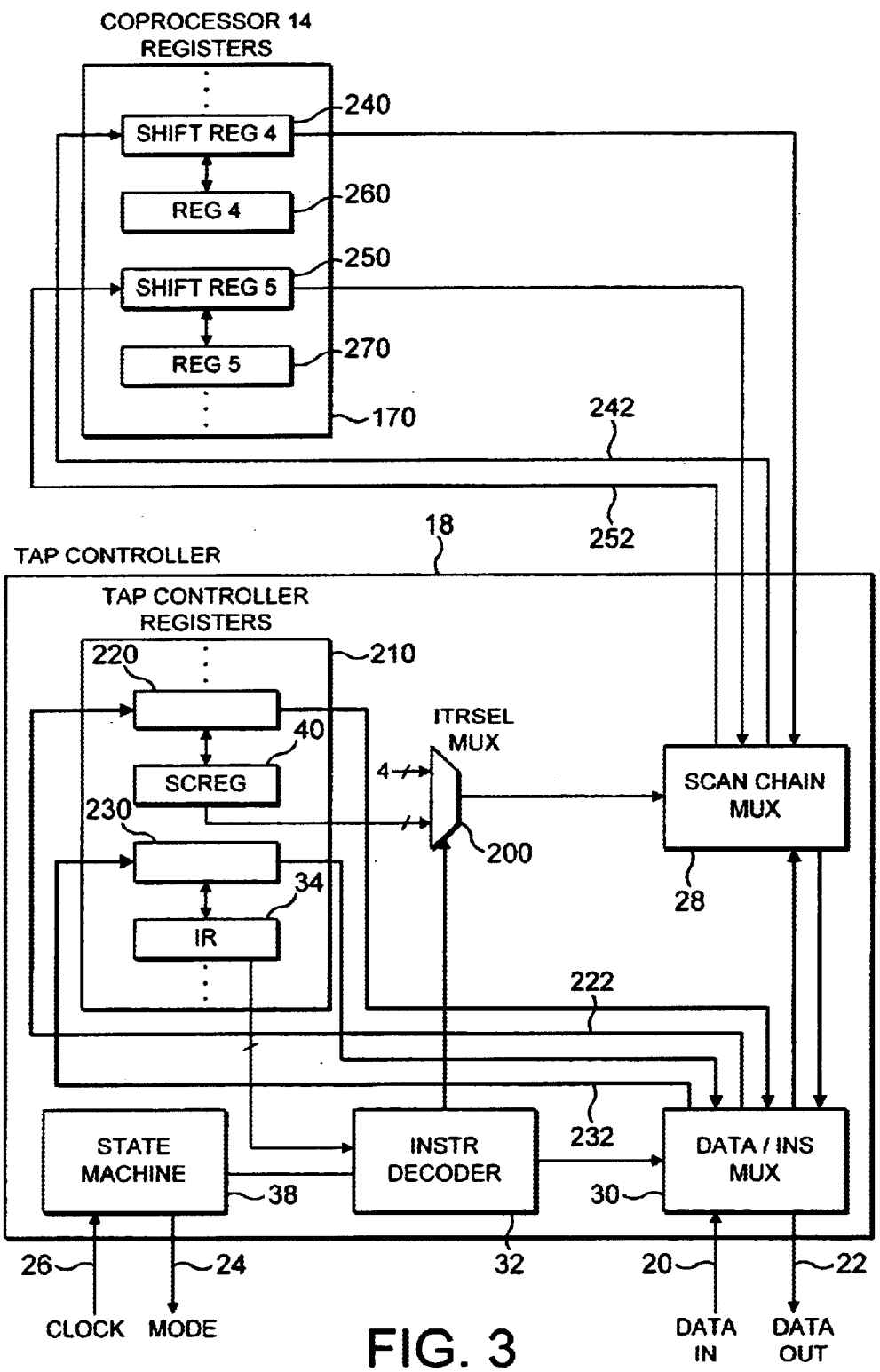
FIG. 3 is a diagram schematically illustrating the scan chains used in accordance with preferred embodiments of the present invention.

FIG. 3 illustrates in more detail the scan chains relevant to an understanding of the preferred embodiment of the present invention, and will be used as a basis for describing how a new instruction is provided in accordance with preferred embodiments of the present invention to improve the efficiency of the above described process.

When the processor core 140 is in a debug state, it can be forced to execute instructions from a certain instruction set via the JTAG TAP interface. Two registers are used for this purpose, namely an Instruction Transfer Register (ITR) and a Data Transfer Register (DTR). In preferred embodiments, the ITR is formed by register 4 260 of coprocessor 14 registers 170, whilst the DTR is formed by register 5 270 of coprocessor 14 registers 170. Associated with register 4 is a scan chain 242 that incorporates a shift register 240 and which is selectable by the scan chain multiplexer 28. Similarly, associated with register 5 270 there is a further scan chain 252, again incorporating a shift register 250. In preferred embodiments, scan chain 242 is referred to as scan chain 4, and scan chain 252 is referred to as scan chain 5, scan chain 4 incorporating shift register 4 240 and scan chain 5 incorporating shift register 5 250.

The ITR 260 is used to insert an instruction into the processor core pipeline, and an instruction from a certain instruction set can be loaded into this register using scan chain 4 and the associated shift register 4. Once the instruction is loaded into the ITR 260, it can be executed by the processor core 140. Typically, this will result in data being stored in the DTR 270. By selecting scan chain 5, and an INTEST instruction, it is possible to output the contents of the DTR 270 into the shift register 250, and to then serially output that data via the scan chain multiplexer 28 and the multiplexer 30 to the data out path of the JTAG TAP interface.

The manner in which the above process is performed in accordance with preferred embodiments of the present invention through the use of a new instruction, referred to herein as ITRSEL, will now be discussed with reference to FIG. 3.

As a first step, the input multiplexer 30 is arranged to scan the Scan_N instruction into the shift register 230 via the scan chain 232, from where it is copied into the IR register 34. The instruction decoder then decodes the Scan_N instruction causing the input multiplexer 30 to select scan chain 222 associated with the SCREG 40. At this point, a scan chain number is read in through the data in channel of the JTAG TAP interface, in this instance, the scan chain number identifying scan chain 5. The identifier for scan chain 5 is stored in the shift registers 220, from where it is copied into SCREG 40.

It is important to note at this point that SCREG 40 now stores a reference to scan chain 5, even though from the description of the process provided earlier, it is clear that we first need to utilise scan chain 4 to set the instruction in ITR 260.

However, this is taken care of via a new instruction, namely the ITRSEL instruction. In particular, the input multiplexer 30 is then arranged to scan the ITRSEL instruction into shift register 230 via scan chain 232, from where it is copied into the IR register 34. The instruction decoder 32 is then arranged to be responsive to the ITRSEL instruction to treat the instruction within the instruction decoder 32 as though it was an EXTEST instruction, and to cause scan chain multiplexer 28 to receive a signal identifying scan chain 4.

Figure 4:
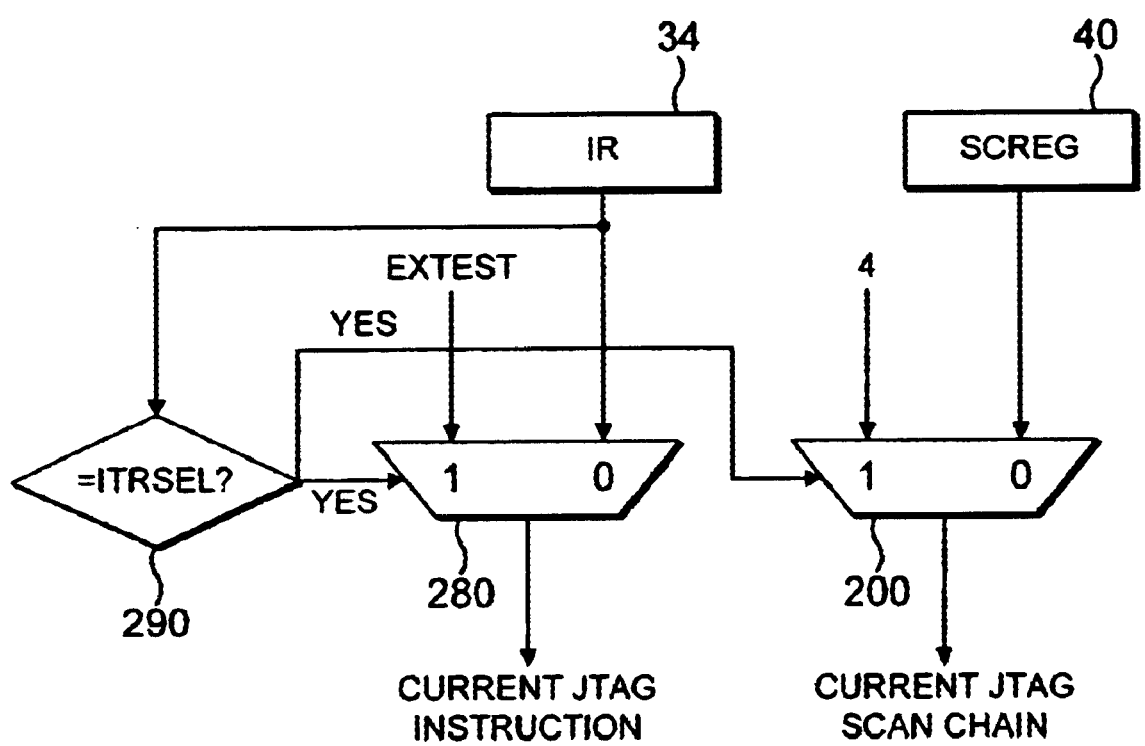
FIG. 4 schematically illustrates the logic provided within the scan chain controller of preferred embodiments of the present invention to enable simulation of outputs from the instruction register and the scan chain register in accordance with preferred embodiments of the present invention.

It will be appreciated that one way to do this is to cause the EXTEST instruction to be stored in IR register 34, and for a reference to scan chain 4 to be stored in SCREG 40. However, this is not the approach that is taken in preferred embodiments of the present invention, but instead a more efficient approach is taken whereby circuitry is provided to simulate as the output of the ITR register 34 the EXTEST instruction, and to simulate as the output of SCREG 40 a reference to scan chain 4. The logic required in this respect is illustrated schematically with reference to FIG. 4.

In particular, a pre-decoder is provided as part of instruction decoder 32 which determines as each instruction is read out of ITR register 34 whether it is the ITRSEL instruction. This is indicated by decision block 290 in FIG. 4. If the ITRSEL instruction is not present in IR register 34, then it can be seen that the instruction within IR register 34 is output via multiplexer 280 to the main body of the instruction decoder 32, whilst the contents of SCREG 40 are output via multiplexer 200 to the scan chain multiplexer 28. However, in the event that the instruction is determined by the pre-decoder to be the ITRSEL instruction, then a select signal is passed to both multiplexers 280 and 200 to cause those multiplexers to output their other input. In particular, in this scenario, the multiplexer 280 is arranged to output the EXTEST instruction to the main body of the instruction decoder 32, rather than the ITRSEL instruction stored in IR register 34. Similarly, the multiplexer 200 is arranged to output a reference to scan chain 4, rather than the reference to scan chain 5 that is currently stored in SCREG 40.

The multiplexer 200 is illustrated in FIG. 3, to show how scan chain multiplexer 28 can be arranged in the presence of the ITRSEL instruction to switch to scan chain 4, irrespective of the content of SCREG 40. The multiplexer 280 is not illustrated as such in FIG. 3, since in preferred embodiments it is incorporated as part of the pre-decoder function provided within the instruction decoder 32.

Accordingly, it can be seen that when the instruction decoder reads in the ITRSEL instruction from IR register 34, it actually decodes an EXTEST instruction within the decoder 32 and causes the scan chain multiplexer 28 to select scan chain 4. When the instruction decoder 32 decodes the EXTEST instruction, it causes the scan chain multiplexer 28 to be coupled via the input multiplexer 30 to the data in and data out paths of the JTAG TAP interface. Accordingly, it is now possible to scan the instruction data required for ITR 260 into the shift register 240, when the instruction data has been stored in the shift register 240, it being copied into ITR 260. As will be discussed later, when the state machine subsequently returns to the run-test/idle state, whilst the instruction EXTEST is still set, this will cause an instruction valid signal to be issued to the processor core 140, causing it to execute the instruction specified in ITR 260. This will result in data being stored by the processor core 140 in DTR 270.

In accordance with the preferred embodiment of the present invention, there is no need to reuse the Scan_N instruction to cause scan chain 222 to be selected, followed by the scanning in of a reference to scan chain 5, prior to executing the INTEST instruction to read out the contents of DTR 270, since a reference to scan chain 5 is already stored within SCREG 40. Instead, it is merely sufficient for the INTEST instruction to be scanned in via scan chain 232 into the shift register 230, from where it is stored into the IR register 34. The instruction decoder 32 will then be responsive to the INTEST instruction to cause the scan chain multiplexer 28 to be connected to the data out path of the JTAG TAP interface via the input multiplexer 30, to enable data to be read out from scan chain 5. This process is controlled by appropriate states within the state machine, and causes the contents of DTR 270 to be copied into shift register 250, and then to be scanned out via the serial interface.

Accordingly, in summary, it can be seen that the placing of an instruction in co-processor 14 register 4 260, followed by the execution of that instruction, and the reading out of the resulting data from co-processor 14 register 5 270 can be achieved by the following sequence of steps in accordance with preferred embodiments of the present invention:

1. Scan the Scan_N instruction into the IR register
2. Scan number 5 into the SCREG register
3. Scan the ITRSEL instruction into the IR register
4. Scan instruction data into shift register 240 and copy to register 4 260
5. Execute instruction on processor core
6. Scan the INTEST instruction into the IR register
7. Copy result data from register 5 270 into shift register 250, and scan out Furthermore, it can be seen that if this process is to be repeated, then it is merely required to re-perform steps 3 to 7 in each subsequent iteration.

This should be contrasted with the steps required in accordance with the earlier described prior art approach, where the ITRSEL instruction is not available, such an approach involving the following sequence of steps:

1. Scan the Scan_N instruction into the IR register
2. Scan number 4 into the SCREG register
3. Scan the EXTEST instruction into the IR register
4. Scan instruction data into shift register 240 and copy to register 4 260
5. Execute instruction on processor core
6. Scan the Scan_N instruction into the IR register
7. Scan number 5 into the SCREG register
8. Scan the INTEST instruction into the IR register
9. Copy result data from register 5 270 into shift register 250, and scan out Accordingly, it can be seen that the prior art approach would require nine steps, as opposed to the seven steps required in accordance with preferred embodiments of the present invention. Furthermore, it should be noted that in accordance with the prior art approach, all nine steps need to be repeated each time the sequence is repeated, as compared with the five steps required when using the technique of preferred embodiments of the present invention.

Another common sequence where the ITR 260 and DTR 270 are used is as follows. Firstly, data is scanned into the DTR 270, and then a processor instruction is scanned into the ITR 260 for execution by the processor. Execution of that instruction causes the data to be transferred from the DTR 270 to, for example, processor memory. Again, the new ITRSEL instruction can be used to significantly increase the speed of execution of the above process, in that the following sequence of steps can be performed in accordance with preferred embodiments:

1. Scan the Scan_N instruction into the IR register
2. Scan number 5 into the SCREG register
3. Scan the EXTEST instruction into the IR register
4. Scan data into shift register 250 and copy to register 5 270
5. Scan the ITRSEL instruction into the IR register -continued 6. Scan instruction data into shift register 240 and copy to register 4 260
7. Execute instruction on processor core Furthermore, it can be seen that if this process is to be repeated, then it is merely required to re-perform steps 3 to 7 in each subsequent iteration.

This should be contrasted with the steps required in accordance with the earlier described prior art approach, where the ITRSEL instruction is not available, such an approach involving the following sequence of steps:

1. Scan the Scan_N instruction into the IR register
2. Scan number 5 into the SCREG register
3. Scan the EXTEST instruction into the IR register
4. Scan data into shift register 250 and copy to register 5 270
5. Scan the Scan_N instruction into the IR register
6. Scan number 4 into the SCREG register
7. Scan the EXTEST instruction into the IR register
8. Scan instruction data into shift register 240 and copy to register 4 260
9. Execute instruction on processor core Accordingly, it can be seen that the prior art approach would require nine steps, as opposed to the seven steps required in accordance with preferred embodiments of the present invention. Furthermore, it should be noted that in accordance with the prior art approach, all nine steps need to be repeated each time the sequence is repeated, as compared with the five steps required when using the technique of preferred embodiments of the present invention.

Figure 5:
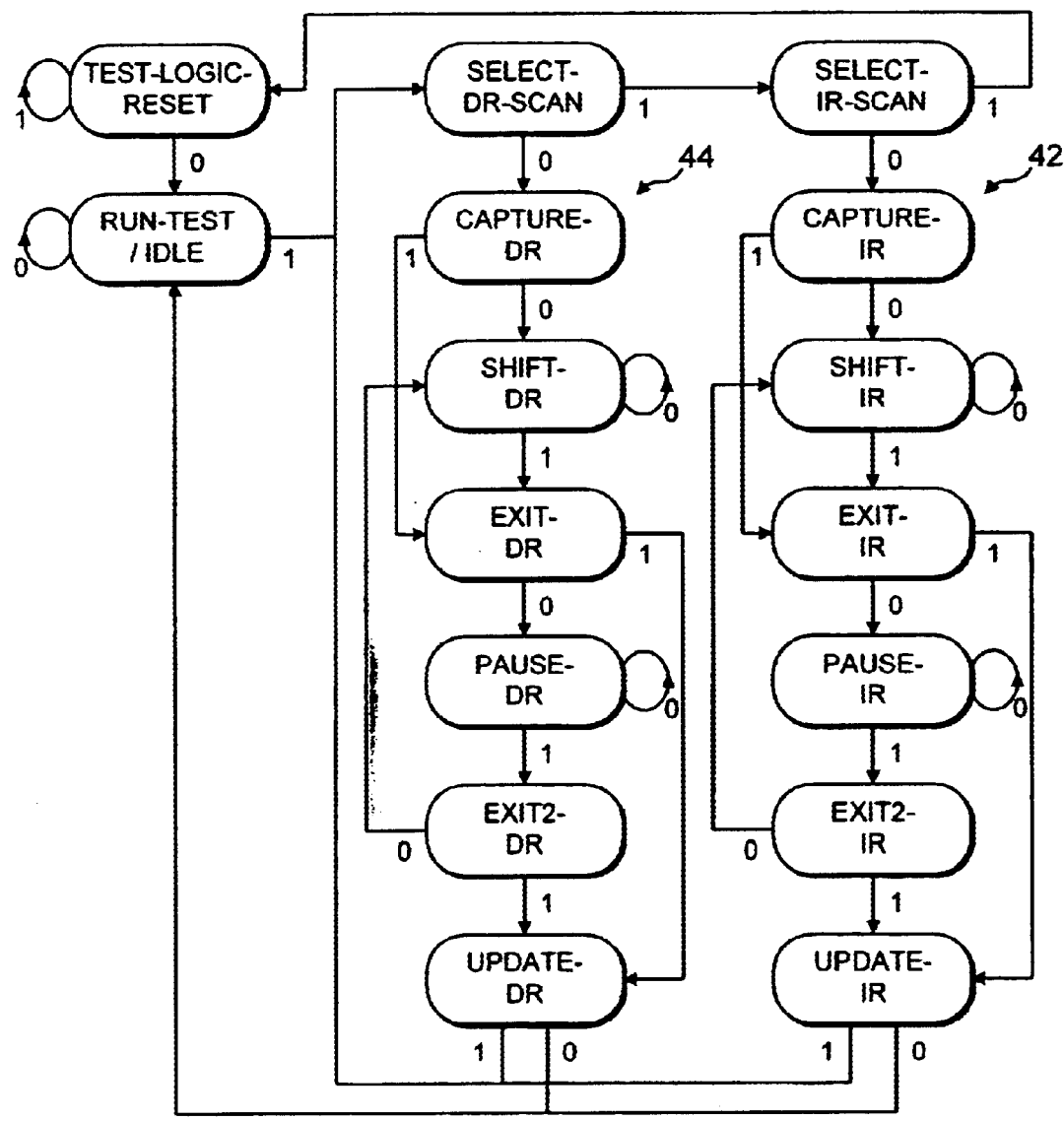
FIG. 5 illustrates a state diagram (based upon IEEE Standard 1149.1-1990) for modes of the scan chain controller of preferred embodiments.

For completeness, FIG. 5 illustrates the states through which the state machine 38 may be passed in accordance with the JTAG Standard. Broadly speaking, these states can be considered as having an instruction capturing and interpretation section 42 and a data capturing and interpretation section 44. The manner in which the new ITRSEL instruction is handled relative to this state diagram to update the ITR register 260 can be described with reference to table 1 below:

TABLE 1

| Action/State | Mode bit required | Data in bits |
|---|---|---|
| Start at Test-Logic-Reset state | N/A | N/A |
| Move to capture IR state | 0110 | **** |
| Cycle around Shift-IR state to receive ITRSEL instruction | 00000 | 11101 |
| Move to Update-IR state; Activate instruction decoder to work as if EXTEST in the IR and switch the ITRSEL mux to the 4 value | 1011 | **** |
| Move to Capture-DR state; Switch Data/Ins Mux to scan chain mux | 10 | ** |
| Cycle around Shift-DR state to receive 33-bit value for the ITR register | (33 0s) | 33-bit value |
| Move to Update-DR State; the ITR gets updated | 1011 | **** |

The state machine 38 starts in the Test-Logic-Reset state, it being unimportant what mode bits or received data bits have preceded that state. The state machine 38 is then moved through the state diagram illustrated in FIG. 5 to the Capture-IR state. The mode bits sequence required to achieve this is 0110. During this move to the Capture-IR state, it is unimportant what bits are present on the data input 20. The state machine then cycles five times through the Shift-IR state to receive the ITRSEL instruction. The mode bits required to achieve this are 00000 and the bits that will be captured at the data input 20 to specify the ITRSEL instruction will be 11101. After the ITRSEL instruction has been captured and stored within the IR register 34 the state machine 38 moves to the Update-IR state by receipt of mode bits 1011. This causes the instruction decoder to be activated as if the EXTEST instruction has been specified in IR register 34, and also causes the ITRSEL mux 200 to output a reference to scan chain 4 to the scan chain multiplexer 28.

The state machine is then moved to the Capture-DR state by receiving mode bits 10. As mentioned earlier, decoding of the EXTEST instruction causes scan chain 4 to be connected to the data in path 20 via input multiplexer 30 and scan chain multiplexer 28. The state machine 38 then cycles for thirty three clock periods about the Shift-DR state by application of mode bit 0 thirty three times. This causes a 33 bit instruction value to be received by the shift register 240, this in effect representing a 32-bit instruction, and a status bit. The state machine 38 then moves to the Update-DR state by application of mode bits 1011. When passing through the Update-DR state, the state machine 38 triggers the scan chain multiplexer 28 to cause the value within shift register 240 to be copied into the ITR register 260.

Finally, the state machine 38 returns to the run-test/idle state by application of mode bit 0, as mentioned earlier, in the presence of the EXTEST instruction still being set, this causing a valid signal to be issued to the processor core 140, causing it to execute the instruction specified in the ITR register 260.

Although in the above described embodiment, the new instruction provided is referred to as the ITRSEL instruction, and causes a process to be performed equivalent to selection of scan chain 4 and decoding of the EXTEST instruction, it will be appreciated that similar performance benefits could be realised if the new instruction were to instead specify a different scan chain number and scan chain controller instruction that are often required. Within the implementation described earlier, other candidates for the generation of a special instruction are an instruction that would cause scan chain 5 to be selected and the INTEST instruction to be decoded, or an instruction which would cause scan chain 5 to be selected, and the EXTEST instruction decoded. Due to there being a limited number of bits for specifying the scan chain controller instructions (in the above example, the instructions are specified by 5 bits), it is not typically practical to form a new instruction for each possible combination. However, it can be seen from the above described embodiment that even by specifying one new instruction to specify a predetermined scan chain number and a predetermined scan chain controller instruction, it is possible to yield significant performance benefits.

Although a particular embodiment has been described herein, it will be apparent that the invention is not limited thereto, and that many modifications and additions thereto may be made within the scope of the invention. For example, various combinations of the features of the following dependent claims can be made with the features of the independent claims without departing from the scope of the present invention.

We claim:

1. An integrated circuit comprising:
    a plurality of circuit elements;
    a plurality of serial test scan chains each coupled to a different one of said circuit elements;
    a scan chain selector responsive to a specified scan chain specifying value to select a corresponding one of said plurality of test scan chains;

a scan chain controller having a serial interface for receiving signals from outside of said integrated circuit, said scan chain controller comprising an instruction decoder for decoding scan chain controller instructions received from said serial interface;

the decoder being responsive to a first scan chain controller instruction to specify a predetermined scan chain specifying value and a second scan chain controller instruction for decoding by the decoder.

2. An integrated circuit as claimed in claim 1, further comprising:

an instruction register for storing a scan chain controller instruction to be decoded by the decoder; and a scan chain register for storing a scan chain specifying value to be referenced by the scan chain selector to determine which test scan chain to select.

3. An integrated circuit as claimed in claim 1, wherein one of said circuit elements is an instruction transfer register for specifying an instruction to be executed by a microprocessor of the integrated circuit, and the predetermined scan chain specifying value identifies a test scan chain incorporating a shift register for shifting data into said instruction transfer register.

4. An integrated circuit as claimed in claim 1, wherein the second scan chain controller instruction is EXTEST.

5. An integrated circuit comprising:

a plurality of circuit elements;

a plurality of serial test scan chains each coupled to a different one of said circuit elements;

a scan chain selector responsive to a specified scan chain specifying value to select a corresponding one of said plurality of test scan chains;

a scan chain controller having a serial interface for receiving signals from outside of said integrated circuit, said scan chain controller comprising an instruction decoder for decoding scan chain controller instructions received from said serial interface;

the decoder being responsive to a first scan chain controller instruction to specify a predetermined scan chain specifying value and a second scan chain controller instruction for decoding by the decoder;

an instruction register for storing a scan chain controller instruction to be decoded by the decoder; and a scan chain register for storing a scan chain specifying value to be referenced by the scan chain selector to determine which test scan chain to select, wherein the decoder is responsive to the first scan chain controller instruction to simulate as the output of the instruction register the second scan chain controller instruction and to simulate as the output of the scan chain register the predetermined scan chain specifying value, without the contents of the instruction register and scan chain register being updated.

6. An integrated circuit as claimed in claim 5, further comprising a first multiplexer located between the instruction register and the decoder having a first input connected to the instruction register and a second input arranged to receive the second scan chain controller instruction, the decoder incorporating a pre-decoder responsive to the first scan chain controller instruction to cause the first multiplexer to output the instruction received at the second input.

7. An integrated circuit as claimed in claim 6, further comprising a second multiplexer located between the scan chain register and the scan chain selector having a first input connected to the scan chain register and a second input arranged to receive the predetermined scan chain specifying value, the pre-decoder being responsive to the first scan chain controller instruction to cause the second multiplexer to output the data received at the second input.

8. An integrated circuit as claimed in claim 5, further comprising a second multiplexer located between the scan chain register and the scan chain selector having a first input connected to the scan chain register and a second input arranged to receive the predetermined scan chain specifying value, the decoder incorporating a pre-decoder responsive to the first scan chain controller instruction to cause the second multiplexer to output the data received at the second input.

9. An integrated circuit comprising:

a plurality of circuit elements;

a plurality of serial test scan chains each coupled to a different one of said circuit elements;

a scan chain selector responsive to a specified scan chain specifying value to select a corresponding one of said plurality of test scan chains;

a scan chain controller having a serial interface for receiving signals from outside of said integrated circuit, said scan chain controller comprising an instruction decoder for decoding scan chain controller instructions received from said serial interface;

the decoder being responsive to a first scan chain controller instruction to specify a predetermined scan chain specifying value and a second scan chain controller instruction for decoding by the decoder, wherein one of said circuit elements is an instruction transfer register for specifying an instruction to be executed by a microprocessor of the integrated circuit, and the predetermined scan chain specifying valite identifies a test scan chain incorporating a shift register for shifting data into said instruction transfer register, wherein the decoder is responsive to the second scan chain controller instruction to cause the scan chain selector to be coupled to the serial interface to enable instruction data received at the serial interface to be passed to the shift register of the test scan chain identified by the predetermined scan chain specifying value.

10. An integrated circuit as claimed in claim 9, wherein once the instruction data has been shifted into the shift register, it is written into the instruction transfer register, and the microprocessor is caused to execute the instruction specified by the instruction data, with the resulting data being written to a data transfer register.

11. An integrated circuit as claimed in claim 10, wherein said data transfer register is one of said circuit elements, and the scan chain register is arranged to store the scan chain specifying value identifying the test scan chain coupled to the data transfer register, that test scan chain incorporating a shift register for shifting data into and out of said data transfer register.

12. An integrated circuit as claimed in claim 11, wherein once data has been written to the data transfer register, the decoder is responsive to a third scan chain controller instruction to cause the scan chain selector to be coupled to the serial interface to enable the data in the data transfer register to be stored into the shift register of the test scan chain coupled to the data transfer register and then output over the serial interface.

13. An integrated circuit as claimed in claim 9, wherein one of said circuit elements is a data transfer register, and the scan chain register is arranged to store the scan chain specifying value identifying the test scan chain coupled to the data transfer register, that test scan chain incorporating a shift register for shifting data into and out of said data transfer register.

14. An integrated circuit as claimed in claim 13, wherein data is first stored in the data transfer register using the second scan chain controller instruction, and then the first scan chain controller instruction is used to shift instruction data into the shift register, from where it is written into the instruction transfer register.

15. An integrated circuit as claimed in claim 14, wherein the microprocessor is caused to execute the instruction specified by the instruction data, this causing the data in the data transfer register to be transferred to a location accessible by the microprocessor.

16. A method of operating an integrated circuit comprising a plurality of circuit elements, and a plurality of serial test scan chains each coupled to a different one of said circuit elements, the method comprising the steps of:

responsive to a specified scan chain specifying value, selecting a corresponding one of said plurality of test scan chains;

employing a decoder to decode scan chain controller instructions received at a serial interface of the integrated circuit;

the decoder being responsive to a first scan chain controller instruction to specify a predetermined scan chain specifying value and a second scan chain controller instruction for decoding by the decoder.

17. A computer program product carrying a computer program for controlling an integrated circuit comprising a plurality of circuit elements, and a plurality of serial test scan chains each coupled to a different one of said circuit elements, the computer program causing the integrated circuit to pet-form the steps of:

responsive to a specified scan chain specifying value, selecting a corresponding one of said plurality of test scan chains;

employing a decoder to decode scan chain controller instructions received at a serial interface of the integrated circuit;

the decoder being responsive to a first scan chain controller instruction to specify a predetermined scan chain specifying value and a second scan chain controller instruction for decoding by the decoder.

* * * * *